United States Patent [19]

Charavit et al.

[11] Patent Number: 4,511,858

[45] Date of Patent: Apr. 16, 1985

[54] FREQUENCY PREPOSITIONING FOR AN INDIRECT FREQUENCY SYNTHESIZER

[75] Inventors: Jean-Claude Charavit; Michèle Vandroux, both of Paris, France

[73] Assignee: Thomson-CSF, Paris, France

[21] Appl. No.: 582,132

[22] Filed: Feb. 22, 1984

Related U.S. Application Data

[63] Continuation of Ser. No. 269,588, Jun. 2, 1981, abandoned.

[30] Foreign Application Priority Data

Jun. 3, 1980 [FR] France ................................ 80 12279

[51] Int. Cl.³ .............................................. H03L 7/18
[52] U.S. Cl. ........................................ 331/10; 331/17; 331/25
[58] Field of Search ............... 331/1 A, 10, 14, 16–18, 331/25; 328/14

[56] References Cited

U.S. PATENT DOCUMENTS 4,103,250 7/1978 Jackson .............................. 331/1 A
4,123,724 10/1978 Das et al. .......................... 331/25 X
4,251,779 2/1981 Kellogg et al. ..................... 331/1 A Primary Examiner—Edward P. Westin
Attorney, Agent, or Firm—Cushman, Darby & Cushman

[57] ABSTRACT

A frequency prepositioning device for an indirect frequency synthesizer having switchable loops comprises an oscillator controlled by a voltage $V_N$ and at least one programmable prepositioning voltage generator. The device essentially comprises a memory device for storing the values of the prepositioning voltage at each transition to each frequency, thus making the device self-adaptive and capable of self-testing.

16 Claims, 9 Drawing Figures

FREQUENCY PREPOSITIONING FOR AN INDIRECT FREQUENCY SYNTHESIZER

This is a continuation of application Ser. No. 269,588, filed June 2, 1981, now abandoned.

BACKGROUND OF THE INVENTION

This invention relates to a frequency-prepositioning device for an indirect frequency synthesizer. The invention is more particularly concerned with an indirect frequency synthesizer having switchable phase loops.

The device according to the invention permits the construction of an indirect frequency synthesizer which makes use of one or a number of phase control loops. The invention makes it possible to improve the rapidity of stabilization—or the time of acquisition—of the output frequency of the synthesizer.

A few constructional designs of a synthesizer will first be briefly recalled. A synthesizer is a device which serves to generate a sine-wave signal, the frequency of which is programmed by digital control. FIG. 1 is a simplified diagram of an indirect frequency synthesizer having a phase loop and based on the principle of control of a submultiple of the frequency of a voltage-controlled oscillator (VCO) in dependence on a stable reference frequency having good spectral purity. This synthesizer is constituted by a voltage-controlled oscillator (V.C.O.) 1 for delivering an output frequency $f_N$ which is dependent on the control voltage $V_N$ applied thereto. The output of oscillator 1 is connected to a scale-of-N frequency-divider circuit 2 (N being a whole number) which delivers an output signal at the frequency $f_N/N$ applied to a phase comparator 3 to which is also applied a so-called reference frequency $f_{ref}$. Phase comparator 3 delivers a signal whose direct-current component is proportional to the phase difference existing between the two signals which are applied thereto. A low-pass filter 4 is connected to the output of said comparator for the purpose of removing the high components of the spectrum of the output signal of the phase comparator. This filtering operation prevents the control voltage $V_N$ applied to the oscillator 1 from producing a parasitic modulation of the output frequency $f_N$. Finally, an amplifier 5 is placed between the filter 4 and oscillator 1 in order to provide the loop gain of the phase control loop of the synthesizer.

Since the switching time of the synthesizer is inversely proportional to the bandwidth of the loop, it is sought to reduce this switching time by increasing the bandwidth. The following different methods for the achievement of this objective are open to choice.

A first such bandwidth increasing method relies on increasing the reference frequency. Unfortunately, this method suffers from two technical limitations: first, since the reference frequency is made higher, the programmable divider must operate at higher frequencies. Second, in the case of a single-loop synthesizer, the reference frequency must be lower than the interval of frequency swing of the synthesizer.

A second method for increasing bandwidth relies on reducing the frequency $f_N$ to be divided, either by frequency transposition or by making use of multiple loops so that the output signal of one loop serves as the frequency of transposition in another loop.

Finally, a third method for increasing bandwidth relies on making use of frequency-prepositioning as shown in FIG. 2. When programming the division rank N, programming of a prepositioning voltage $V_{NP}$ is carried out at the same time, this voltage being added to the control voltage delivered by the control circuit. This solution minimizes the frequency deviation which has to be compensated by the control loop after a frequency switchover. However, this prepositioning operation cannot be accurate by reason of the non-linearities and dispersions of the voltage-frequency characteristics of the voltage-controlled oscillator as a function of time and also as a function of temperature.

SUMMARY OF THE INVENTION

In order to overcome these disadvantages, the invention provides an improved frequency-prepositioning device.

In accordance with one distinctive feature of the invention, the frequency-prepositioning device for an indirect synthesizer having switchable phase loops for controlling a submultiple of the frequency of an oscillator in dependence on a stable frequency, said oscillator being controlled by a voltage $V_N$, comprises at least one programmable prepositioning-voltage generator. In respect of each frequency, the prepositioning voltage $V_{NP}$ which is programmed for each loop is added to the error voltage $V_{NE}$ established in the same loop in order to give the control voltage $V_N$ of the oscillator. The prepositioning device essentially comprises a device for storing values of the prepositioning voltage at each transition to each frequency $f_N$, these values being employed at the following transitions to the same frequency in order to control the oscillator and thus to make the device self-adaptive.

BRIEF DESCRIPTION OF THE DRAWINGS

Other features of the invention will be more apparent to those skilled in the art upon consideration of the following description. Apart from FIG. 1 which has already been described, reference will be made to the accompanying drawings, wherein.

In these different figures, elements which are identical and perform the same functions are designated by the same references.

DESCRIPTION OF THE PREFERRED EMBODIMENTS

Figure 1:
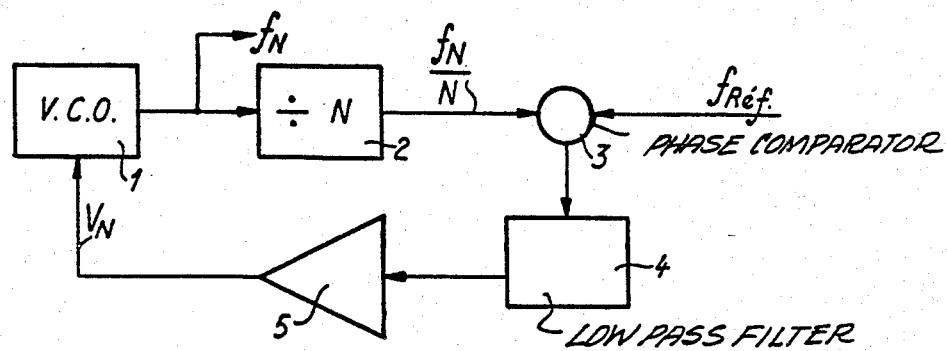
Figure 2:
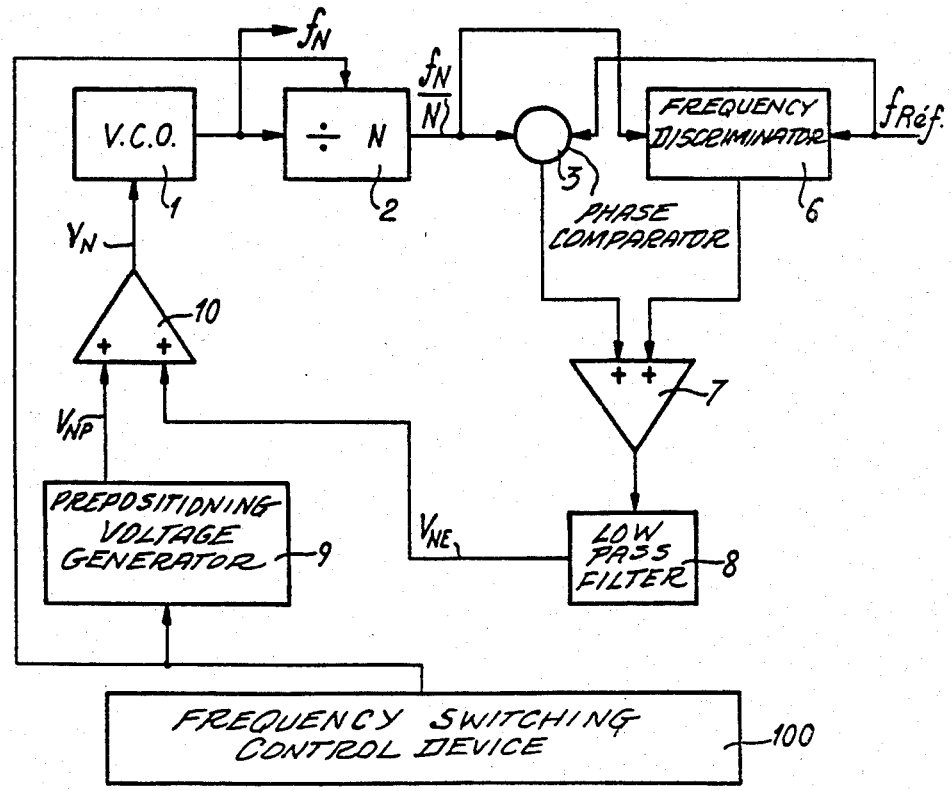
FIG. 2 illustrates an indirect frequency synthesizer comprising a frequency-prepositioning device according to the prior art.

The indirect frequency synthesizer shown in FIG. 2 includes a frequency-prepositioning device according to the prior art. As in the case of FIG. 1, this synthesizer is constituted by a voltage-controlled oscillator (VCO) 1, a divider circuit 2 for dividing the output frequency $f_N$ of the oscillator 1 which is controlled by a frequency-switching control device 100, a phase comparator 3 to which has been added a frequency discriminator 6 placed in parallel with the comparator 3. At the time of a frequency switchover of high amplitude which comes close to or oversteps the phase-loop locking range, locking is effected by making use of a frequency discriminator which delivers a voltage proportional to the difference in frequencies applied thereto. When the compared frequencies are identical, the discriminator does not deliver a control voltage. Rather, the control voltage is delivered by the phase comparator which has taken over. A summing amplifier 7 receives the signals from the comparator 3 and discriminator 6 and delivers a signal which is filtered by a low-pass filter 8; this latter performs the same function as the low-pass filter 4 described with reference to FIG. 1.

When assimilating the voltage-frequency characteristic of the voltage-controlled oscillator 1 with a straight line of the form:

$$f_N = f_o + k \cdot V,$$

where $f_o$ is a constant equal to the value of $f_N$ when $V=0$ it is found that a correspondence exists between programming of the division rank N and the corresponding control voltage $V_N$ of the oscillator:

$$f_N = N \cdot f_{ref} = f_o + k V_N$$

whence $$V_N = \frac{-f_o}{k} + N \frac{f_{ref}}{k} = a + b \cdot N$$

It is therefore possible to carry out programming of the division rank N at the same time as programming of a prepositioning voltage $V_{NP}$ which is added to the control voltage delivered by the control loop.

Thus in order to minimize the frequency deviation to be compensated by the control loop after a frequency switchover, a prepositioning voltage generator 9 is added to the loop in such a manner as to position the oscillator 1 as close as possible to the frequency to be delivered at the time of the frequency switchover. The frequency-switching control device 100 produces action both on a divider circuit 2 and on the voltage generator 9. Voltage generator 9 delivers a voltage $V_{NP}$ which, combined by means of a summing circuit 10 with the voltage $V_{NE}$ delivered by the filter 8, constitutes the control voltage $V_N$ of the oscillator 1. It would be highly advantageous to ensure exact positioning on the frequency $f_N$ to be delivered in order that the control loop may thus have the sole function of controlling the phase of the VCO or voltage-controlled oscillator 1 since this would have the effect of increasing the rate of stabilization of the output frequency of the synthesizer. However, as has been stated earlier, technological limitations prevent such high accuracy of positioning and it is the precise aim of the present invention to overcome this disadvantage.

Figure 3:
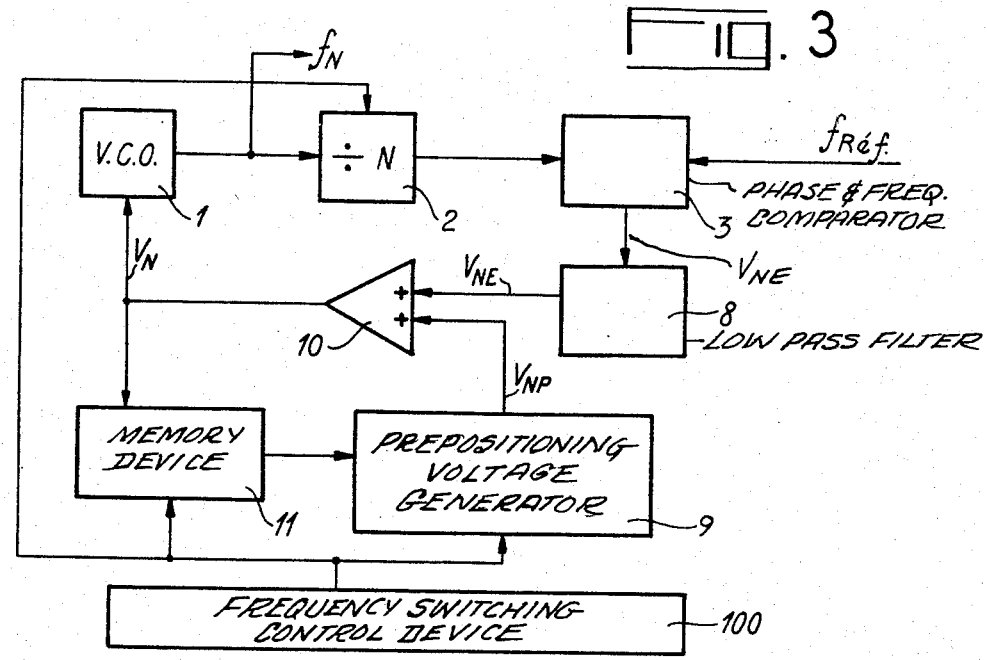
FIG. 3 is a schematic diagram of an indirect frequency synthesizer comprising a frequency-prepositioning device according to the invention.

FIG. 3 is a schematic diagram of an indirect frequency synthesizer comprising a prepositioning device according to the invention. The synthesizer is constituted by a VCO-type oscillator 1 for delivering a signal having a frequency $f_N$, said frequency being divided by N by a divider circuit 2, the output signal of which is compared with a reference signal in a phase and frequency comparison circuit 3. This circuit delivers a so-called error voltage $V_{NE}$ which is filtered by the low-pass filter 8. Since the invention consists in continuously determining the voltage-frequency characteristic of the VCO in order to control the prepositioning-voltage generator and to bring this latter to a value which is as close as possible to the exact value, the control loop comprises a memory device 11 for storing the control voltages $V_N$ of the oscillator 1, said storage device being connected to the prepositioning-voltage generator 9. The divider circuit 2, the memory device 11 and the generator 9 are connected to the frequency-switching control device 100. As in FIG. 2, the prepositioning voltage $V_{NP}$ delivered by the generator 9 is added to the error voltage $V_{NE}$ in a summing circuit 10 which delivers at the output the control voltage $V_N$ of the VCO oscillator 1.

The operation of this device is as follows: at each frequency switchover, the memory device 11 delivers to the generator 9 the value of the voltage $V_N$ which was stored at the time of previous transitions to the same frequency $f_N$ and the value of the division rank N of the circuit 2 is changed. This stored voltage becomes the prepositioning voltage $V_{NP}$ and is added to the error voltage $V_{NE}$ obtained in the phase loop which has attained its equilibrium. The sum of these two voltages $V_{NE}$ and $V_{NP}$ provides the new control voltage $V_N$ of the VCO oscillator 1 which is also stored in the device 11 at the same time.

At each transition to each value $f_N$, the new value of the control voltage $V_N$ of the VCO oscillator is stored in order to compensate for equipment drift and if necessary in order to improve the accuracy of measurements by filtering the successive measurements. These measurements may be performed:

either during operation of the synthesizer in steady-state operation as the transition to each frequency $f_N$ takes place: if the time during which the frequency is not modified is of sufficient duration, it is possible to carry out filtering of the control voltage $V_N$ of the VCO 1 in order to eliminate fluctuations introduced by the control operation. Should this time interval be insufficient, filtering can be carried out from a number of samples measured at successive transitions to the same frequency. This filtering operation may also be adapted in order to determine equipment drift or to carry out corrections by interpolation on prepositioning voltages $V_N$ which have not been refreshed for too long a time beforehand or in order to carry out dynamic testing of the good operation of the synthesizer;

or during the periods in which the synthesizer does not have to deliver a useful signal, for example in a transmission system during dead transmission-time intervals: during these dead time intervals, the synthesizer is capable of carrying out cyclic scanning of the different possible frequencies. The dead-time frequency must in that case be sufficiently high in comparison with the rate of drift of the synthesizer.

The prepositioning device according to the invention is self-adaptive since the prepositioning voltage generator delivers at each transition to the frequency $f_N$ a voltage $V_N$ which is as close as possible to the value to be provided in order to control the oscillator. Thus the speed of positioning of the synthesizer at the desired value of frequency is increased without modifying the phase control loop. In consequence, the spectral purity of the synthesizer, which is obtained by virtue of the stable reference frequency $f_{ref}$, also remains unmodified.

Figure 4:
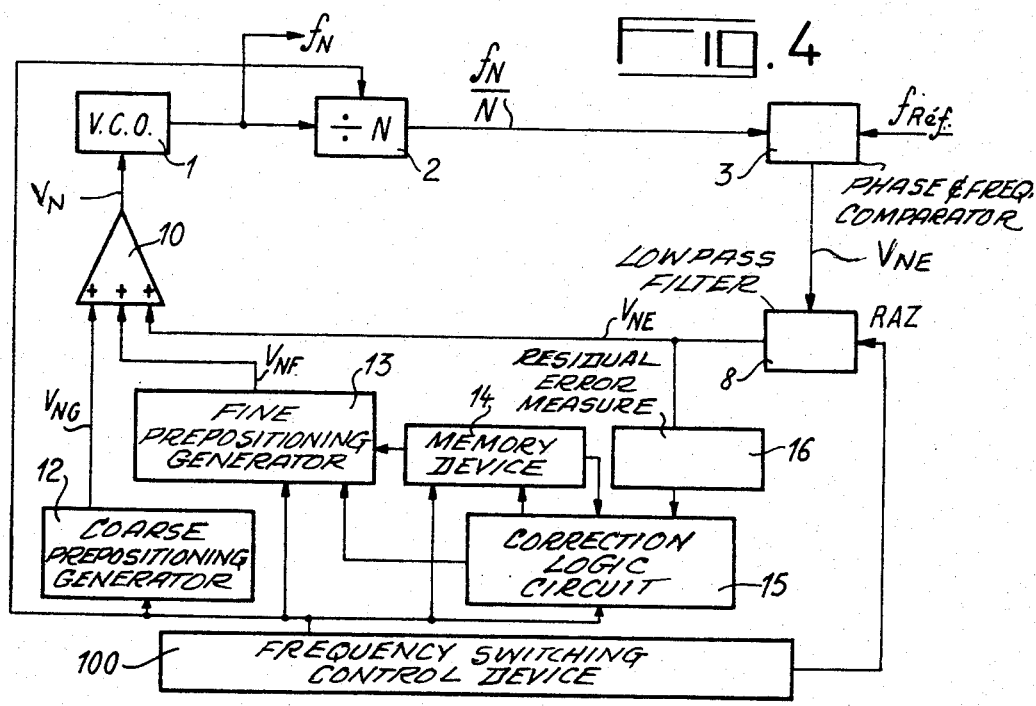
FIGS. 4 to 8 show alternative arrangements of the schematic diagram of a frequency synthesizer having a single switchable loop according to the invention.

The schematic diagram of FIG. 4 shows a first alternative embodiment of a prepositioning device in accordance with the invention. The prepositioning voltage is split-up into two components $V_{NG}$ and $V_{NF}$. The first component $V_{NG}$ is fixed and serves to carry out the operation known as "coarse" prepositioning which produces the same action as the prepositioning voltage of the prior art. The second component $V_{NF}$ is variable and serves to carry out the operation known as "fine" prepositioning which follows the fluctuations and drifts of the control voltage $V_N$ of the VCO. The corrections of the component $V_{NF}$ are a function of the value of the control voltage $V_N$ and therefore of the residual filtered prepositioning error voltage $V_{NE}$ delivered by the phase comparator.

The device comprises the same circuits 1, 2, 3, 8 and 10 as those of the device shown in FIG. 3; to these circuits are added a coarse prepositioning generator 12, a fine prepositioning generator 13, a correction logic circuit 15, a memory device 14 for storing the fine prepositioning voltage $V_{NF}$—all four circuits being connected to the frequency-switching control device 100 as well as the scale-of-N divider circuit 2—and a circuit 16 for measuring the residual error voltage $V_{NE}$. At each frequency switchover, control device 100 produces action on the circuit for dividing by N in which the whole value of N is modified and on the coarse prepositioning generator 12 which delivers an initially programmed value of $V_{NG}$. The same circuit 100 produces action at the same time on the memory device 14 which then delivers to the correction logic circuit 15 the value of the fine prepositioning voltage $V_{NF}$ which was stored at the time of the previous transition to the same frequency. When equilibrium is established in the phase loop, the value of the residual error voltage $V_{NE}$ produced by the circuit 3 and filtered by the low-pass filter 8 is measured in the circuit 16 and added to the voltage $V_{NF}$ in the correction logic circuit 15. Circuit 15 carries out a correction of the fine prepositioning voltage $V_{NF}$ which tends to reduce the error voltage $V_{NE}$ to zero and replaces said error voltage by a new value $V'_{NF}$. The summing circuit 10 then adds the three voltages $V_{NG}$, $V'_{NF}$ and $V_{NE}$ in order to give the control voltage $V_N$ to the VCO oscillator 1 which then effectively delivers the desired frequency $f_N$.

The new value $V'_{NF}$ is then stored in the memory circuit 14 in order to be employed for the following transition in respect of the same frequency $f_N$ and the filter 8 receives a zero-reset command from the logic circuit 15 in order to ensure that, when the following switchover to another frequency takes place, the voltage $V_{NE}$ is zero before equilibrium is established in the phase loop.

In practical terms, the error voltage $V_{NE}$ can be measured by means of an analog-to-digital conversion and sampling device, for example. The quantization step can be of the same order of magnitude as the peak amplitude of the variations in error voltage. When the switchable frequency changes from the value $f_N$ to the value $f'_N$, the correction logic utilizes the measured value of the error voltage $V_{NE}$ in order to carry out a correction of the fine prepositioning voltage $V_{NF}$ and in order to replace this latter by a new value $V'_{NF}$. Postulating that in steady-state operation, the control voltage $V_N$ of the VCO oscillator is equal to the sum of coarse and fine prepositioning voltages and of the error voltage, taking the multiplication factors $\alpha$, $\beta$ and $\gamma$ into account:

$$V_N = \alpha \cdot V_{NG} + \beta \cdot V_{NF} + \gamma \cdot V_{NE}$$

the correction which tends to reduce the error voltage to zero results in the fact that:

$$\beta \cdot V'_{NF} = \beta \cdot V_{NF} + \gamma V_{NE}$$

whence $$V'_{NF} = V_{NF} + \frac{\gamma}{\beta} \cdot V_{NE}$$

The relation just given indicates that, if the fine prepositioning voltage generator is constructed from a digital-to-analog converter, the quantization step is in the ratio $\gamma/\beta$ with respect to the step of the analog-to-digital converter for measuring the error voltage $V_{NE}$. The circuit 14 for storing the numerical values of the voltages $V_{NF}$ in respect of the different switchable frequencies of the synthesizer is a random access memory (RAM) addressed by the frequency control unit 100.

The coarse prepositioning generator 12 can be constituted by a digital-to-analog converter controlled eigher directly by the frequency control unit 100 or via a read only memory (ROM) which serves to carry out code conversion and possible compensation for non-linearities of the voltage-frequency characteristic of the VCO.

In order to introduce the initial values of the fine prepositioning voltages in the circuit 13, at least one transition to each frequency of the synthesizer must be carried out at the time of startup. In order to facilitate the initialization, the low-pass filter 8 can comprise a switchable passband which is of greater width at the time of the first transition to each synthesizer frequency and is then of smaller width.

Figure 5:
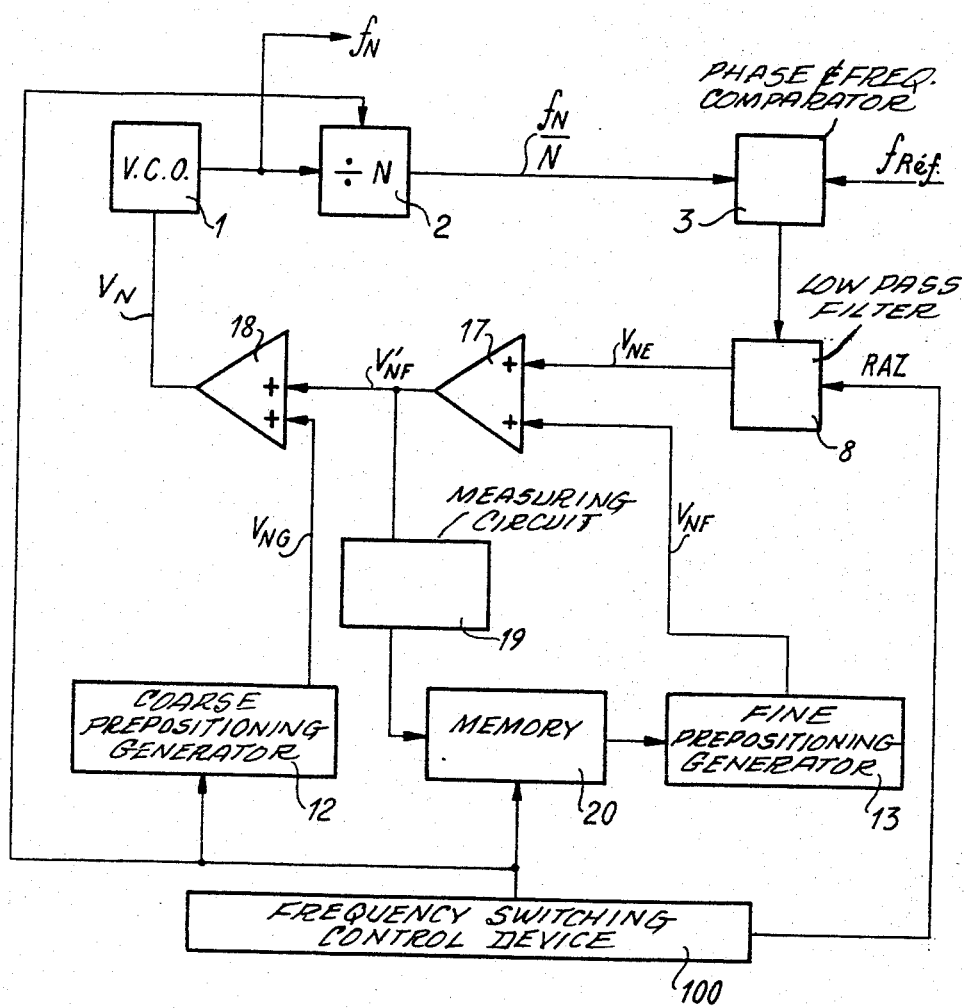

A second alternative embodiment of the schematic diagram of a prepositioning device according to the invention is shown in FIG. 5. There is no longer any correction logic circuit which corrects the fine prepositioning voltage $V_{NF}$ as a function of the value of the residual error voltage $V_{NE}$.

As in the previous embodiment, the frequency-switching control device 100 produces action on the divider circuit 2, the coarse prepositioning generator 12 and a memory circuit 20 which, at each frequency changeover, stores the value of the voltage $V'_{NF}$ resulting from the sum of the fine prepositioning voltage $V_{NF}$ and of the error voltage $V_{NE}$. This voltage $V'_{NF}$ is measured by the circuit 19. Thus, at each frequency changeover, the logical chain system carries out the following functions:

the filter 8 reset to zero by the control device 100 in order to reduce $V_{NE}$ to zero;

the control device 100 puts the memory 20 in the reading and selection condition in order to deliver to the generator 13 the fine prepositioning voltage value $V_{NF}$;

stabilization "wait" condition which gives the value of the error voltage $V_{NE}$, this value being added to $V_{NF}$ in the summing circuit 17;

putting of the memory 20 in the write condition in order to store the value $V'_{NF} = V_{NF} + V_{NE}$ and blocking of the memory.

At the same time, the switching control device 100 has acted on the generator 12 for producing the coarse prepositioning voltage value $V_{NG}$ and on the programmable divider circuit 2. At the instant of initiation of writing of the memory 20, the synthesizer delivers the required frequency.

Memorization of the fine prepositioning device can be carried out in a number of different ways, two of which will be explained hereinafter.

Figure 6:
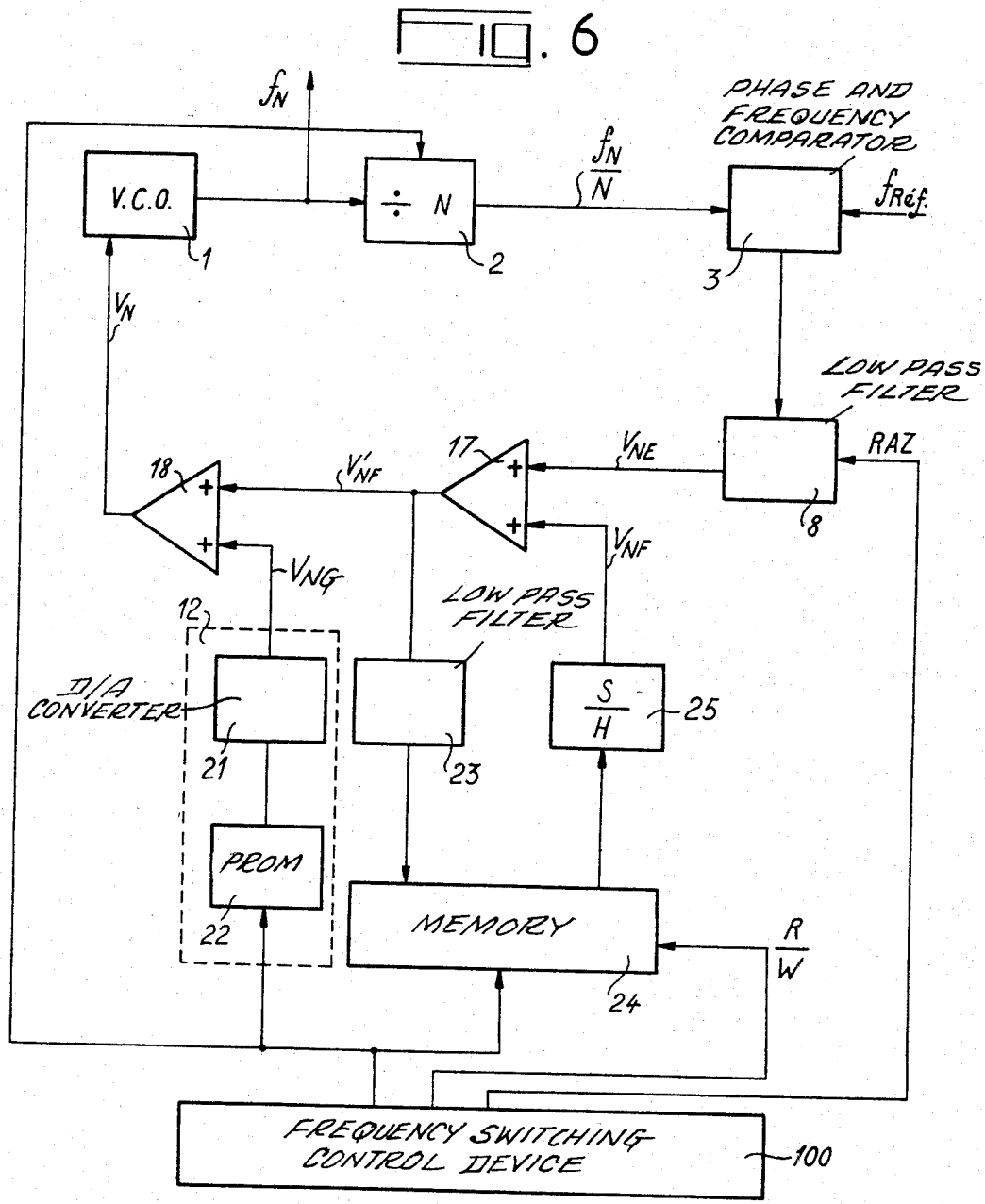

FIG. 6 shows one type of analog fine storage. The elements designated by the same references as in the previous figure will not be described. As stated earlier, the coarse prepositioning generator 12 can be constituted by a digital-to-analog (D/A) converter 21 controlled by the frequency-switching control device 100 via a read only memory (ROM) 22 of the programmable read-only memory (PROM) type, for example. The fine prepositioning voltage $V'_{NF}$ at the output of the summing circuit 17 is filtered through the low-pass filter 23, then put into memory circuit 24 which is a read write memory of the random-access analog type controlled directly by the frequency-switching control device 100. Between the memory circuit 24 and one of the inputs of the summing circuit 17, there is placed a sample and hold (S/H) circuit 25 which performs the function of interface.

The process involved in the operation of the synthesizer at each switchover to a frequency $f_N$ is as follows:

zero-resetting of the filter 8 by means of the control device 100;

putting of the memory circuit 24 in the reading and selection condition;

releasing of the sample and hold circuit 25 which delivers to the input of the summing circuit 17 the value of the voltage $V_{NF}$ stored during the previous transition to said frequency $f_N$;

blocking of the circuit 25;

unblocking of the filter 8;

stabilization "wait" of the phase loop;

putting of the memory circuit 24 in the write condition; at this instant, the synthesizer delivers the correct frequency;

blocking of the memory circuit 24.

At the same time, the frequency control unit 100 had produced action on the memory circuit 22 and the digital-to-analog converter 21 as well as on the programmable divider circuit 2.

Figure 7:
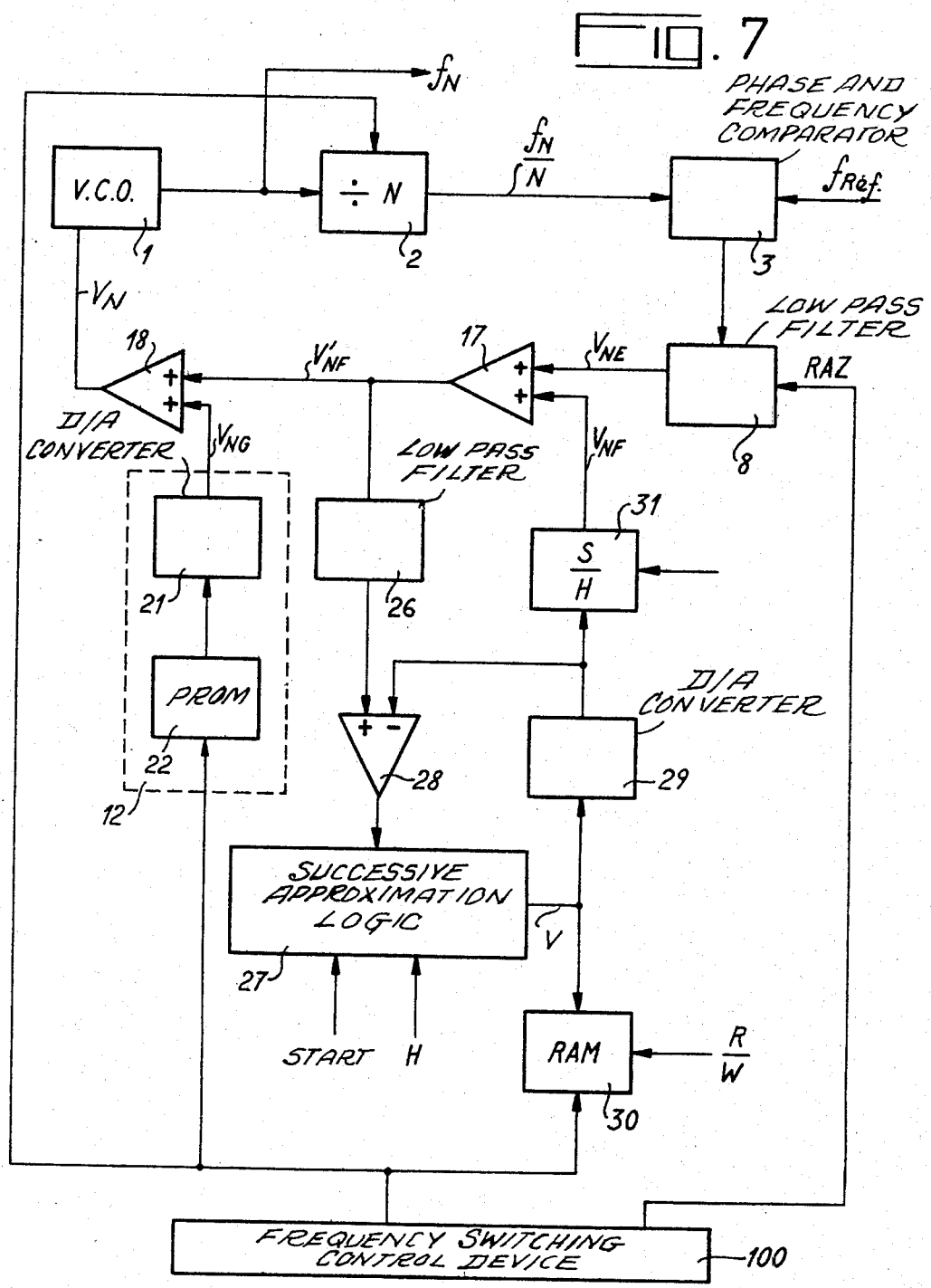

FIG. 7 shows one type of digital fine storage. As in the preceding embodiment, the elements which are designated by the same numerals as in the previous figures have the same function and will not be described further. The difference which exists between this figure and the previous figure lies in the design of the fine prepositioning voltage generator, the devices for measurement and restitution of the error voltage being combined into one device which performs both functions one after the other.

In this alternative embodiment of the synthesizer shown in FIG. 7, the operation of the logical sequence of operations involving measurement and restitution of the error voltage at each frequency switchover is as follows:

the low-pass filter 8 is set to zero by the control unit;

the memory device 30 is put in the reading and selection state in order to give the voltage $V_{NF}$ stored during the previous transition to the same frequency;

releasing of the sampling and blocking circuit 31;

waiting for stabilization of the converter 29;

blocking of the sampler 31;

unblocking of the filter 8;

waiting for stabilization of the phase loop (at this instant, the synthesizer delivers the correct frequency $f_N$);

measurement of the voltage $V_{NF}$ by the low-pass filter 26;

initialization (START) of the logic system of successive approximations 27;

the logic system of successive approximations 27 delivers a digital voltage V which is converted analogically in the converter 29 in order to be compared with the analog voltage $V'_{NF}$ in the circuit 28; when these two analog voltages V and $V'_{NF}$ are equal, the logic system stops and the digital voltage then obtained is stored in the random-access memory (RAM) 30;

blocking of the memory 30.

At the same time, the frequency-switching control unit has produced action on the memory circuit 22 which delivers the coarse prepositioning voltage $V_{NG}$ via the digital-to-analog converter 21 as well as the circuit 2 for dividing by N.

A device of this type makes it possible to compensate for drift of the system provided such that drift is slow in comparison with the frequency of utilization of each frequency which is available within the synthesizer.

In one example of construction, a synthesizer of the type described in the previous figure comprises, in addition to the frequency-switching control unit, an interface system with a computer or microprocessor and a sequential logic circuit. Thus a synthesizer of this type can have four modes of operation:

an initialization mode in which a computer may be utilized in order to determine the first fixed-prepositioning voltages;

a normal mode in which the synthesizer is controlled in this case by the frequency-switching control unit;

a test mode during which a computer collects the values of the fine prepositioning voltage of the random-access memory in order to carry out tests of probability and continuity. If the voltage-frequency characteristic of the VCO oscillator as given by the manufacturer is known, it accordingly becomes possible to check whether the synthesizer in fact delivers a similar characteristic which remains within the limits of variations indicated by the manufacturer;

a conservative mode in which the synthesizer is not employed and the system covers the entire range of useful frequencies in order to update the RAM with the various drifts.

Figure 8:
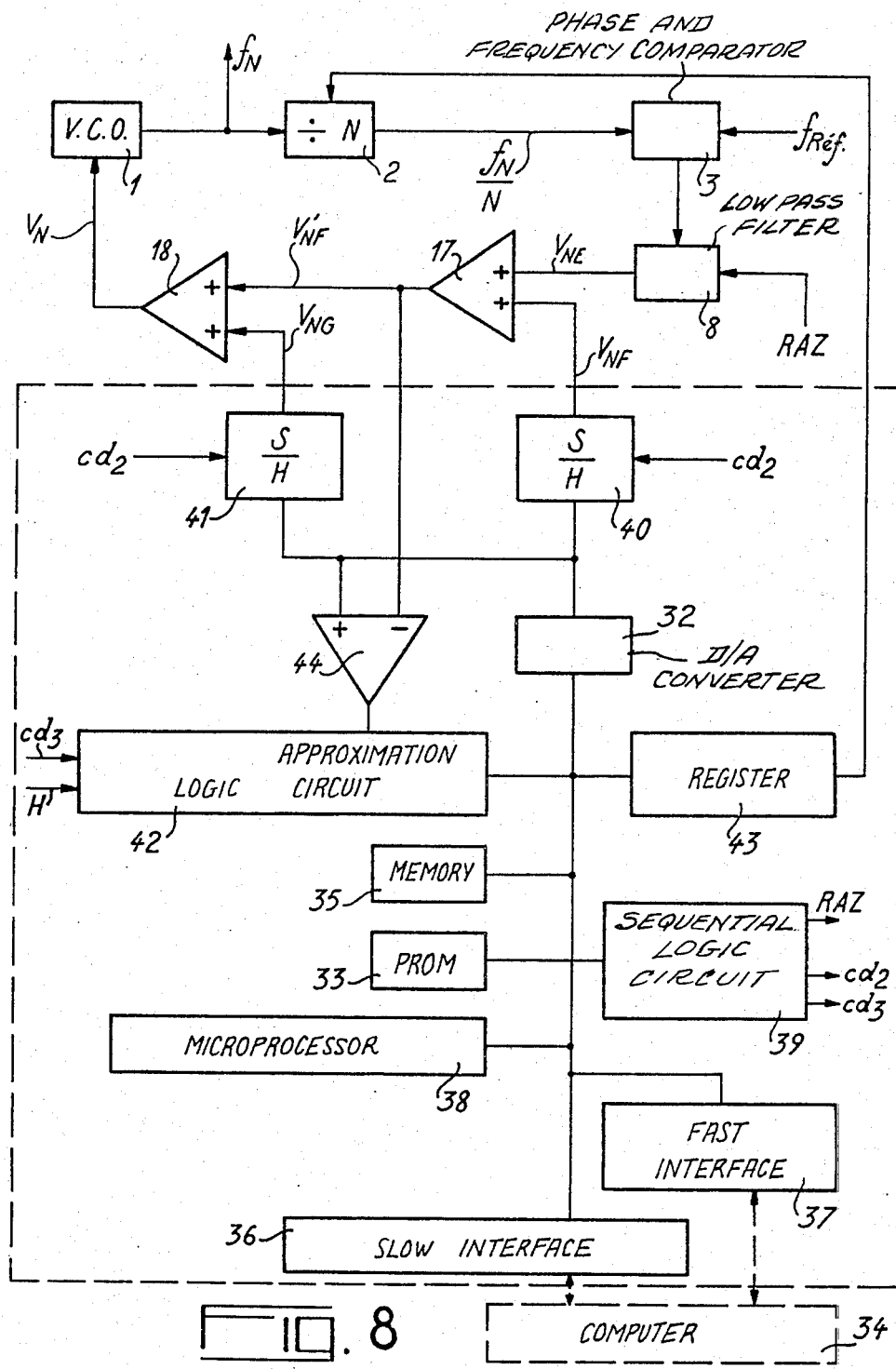

FIG. 8 shows one embodiment of a synthesizer according to the invention in which a large section can be integrated in a large-scale integration circuit (LSI circuit). A single digital-to-analog converter 32 is necessary for the two coarse and fine prepositioning operations. A memory device 33 of the PROM type contains:

the law of coarse prepositioning;

the test program;

the program of the conservative mode;

the program of connection with the computer 34;

the filtering programs.

The memory device 35 of the RAM type contains:

the values of the fine-prepositioning voltages;

the working memories.

The slow interface 36 permits the modes of initialization and control. The fast interface 37 permits the normal mode of fast transfer and is provided with priority interruption of the microprocessor 38. The sequential logic circuit 39 is programmable, especially in the case of digital filtering by the microprocessor. This circuit 39 via signals RAZ, $cd_2$ and $cd_3$ controls zero-resetting of the filter 8, blocking and unblocking of the sample and hold (S/H) circuits 40 and 41 connected respectively to the summing circuits 17 and 18 which correspond to the fine and coarse prepositioning operations, and also controls the successive approximation logic circuit 42. A register 43 is connected to the scale-of-N divider circuit 2.

At each frequency switchover, the different functions performed by the device take place successively as follows:

the low-pass filter 8 is reset to zero by the control unit;

the memory device 33 is put into the selection condition in order to deliver the digital coarse-prepositioning voltage $V_{NG}$ which the digital-to-analog converter 32 converts by the analog method of computation;

blocking of said voltage $V_{NG}$ in the sample and hold (S/H) circuit 41;

the memory device 35 is put in the reading and selection state in order to deliver the fine-prepositioning voltage $V_{NF}$ which was stored at the time of the previous transition to the frequency $f_N$;

blocking of said voltage $V_{NF}$ delivered by the digital-to-analog converter 32 into the sampling and blocking circuit 40;

programming of N in the divider circuit 2;

unblocking of the low-pass filter 8;

waiting for stabilization of the phase loop;

initialization of the successive-approximation logic circuit 42;

the logic circuit 42 for successive approximations delivers a digital voltage V which is converted analogically in the converter 32 in order to be compared with the analog voltage $V'_{NF}$ in the circuit 44; when these two analog voltages V and $V'_{NF}$ are equal, the logic circuit stops and the digital voltage then obtained is stored in the memory 35 which is then blocked.

Figure 9:
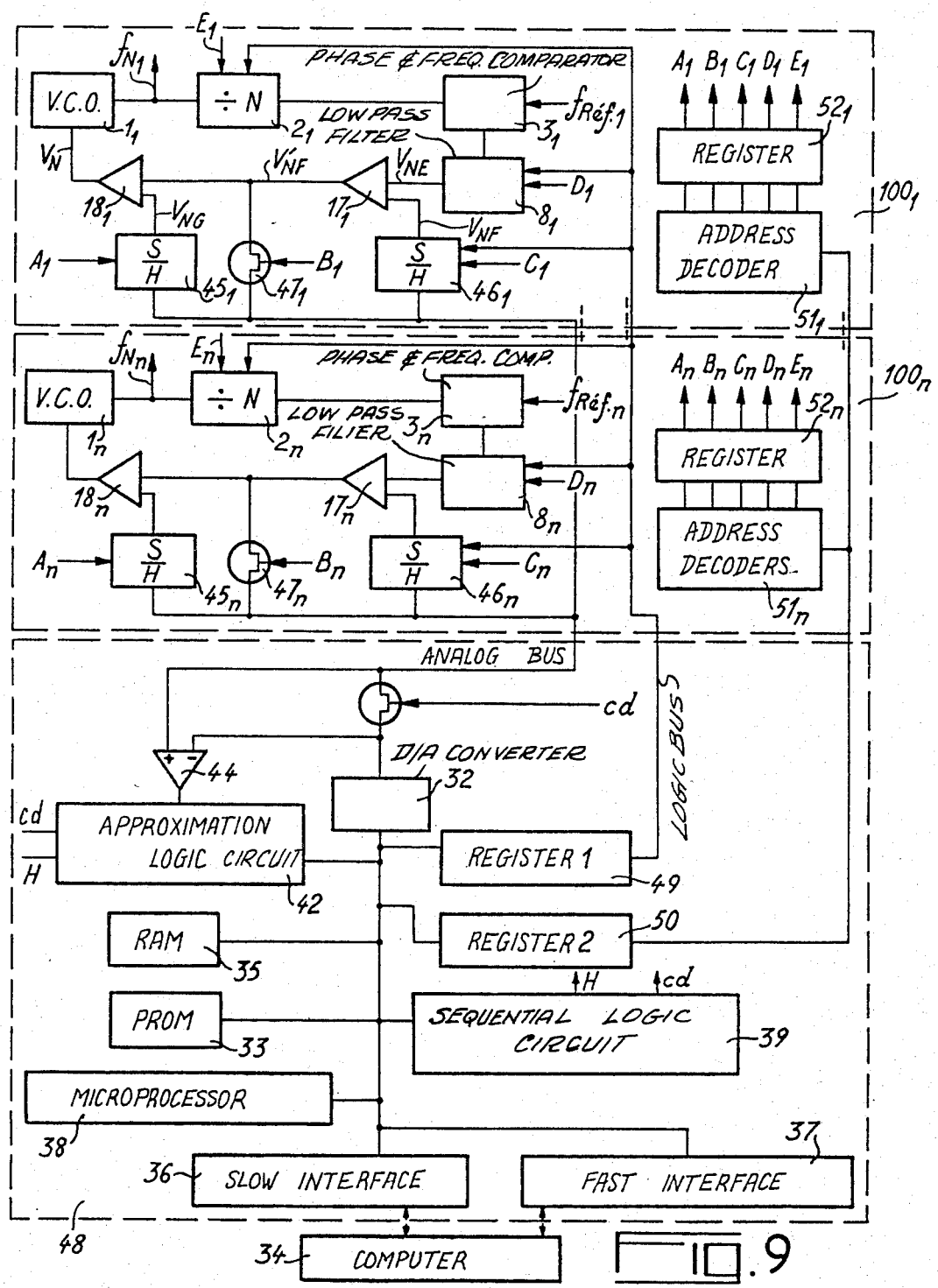
FIG. 9 is a schematic diagram of a frequency synthesizer having a plurality of switchable loops according to the invention.

A frequency synthesizer having a plurality of loops may also be constructed in accordance with the invention, with a portion which is integrated in a LSI circuit as shown in FIG. 9. This figure illustrates the loop $100_1$ and the loop $100_n$ each comprising the elements $1_i$, $2_i$, $3_i$, $8_i$, $17_i$ and $18_i$ which are identical with those of the other figures, as well as two sampling and blocking circuits $45_i$ and $46_i$ (where i varies from 1 to n) corresponding to the coarse and fine prepositioning operations and a switching device $47_i$ provided by a field-effect transistor, for example. The section 48 which is designed as a LSI circuit is the same as in FIG. 9 and is common to all the loops. For this reason, said section comprises two registers 49 and 50, the first register being connected to all the divider circuits 2 and the second register being connected to address decoders $51_i$ (where i varies from 1 to n) which are in turn connected to registers $52_i$ for initiating the functions $A_i$, $B_i$, $C_i$, $D_i$ and $E_i$.

The different steps of the sequential logic of the circuit are as follows: at the outset, the microprocessor 38 prepositions each loop $100_i$ by programming the divider circuits $2_i$ by means of the function $E_i$, by directing the coarse prepositioning voltages $V_{NG}$ to the sampling and blocking circuits $45_i$ which are controlled by the function $A_i$ and by directing the fine prepositioning voltages $V_{NF}$ to the sampling and blocking circuits $46_i$ which are controlled by the function $C_i$. Since the phase loop is stabilized, the microprocessor will collect the error voltages in each loop at the level of the switching devices $47_i$ which are controlled by the function $B_i$, will convert them by means of the devices 44, 42 and 32 as was the case in FIG. 8, and will store them in the random-access memory 35. This process is the same as the one described earlier but is carried out in the case of each loop. It can be noted that a reference frequency $f_{ref_i}$ can be given by the output frequency of another loop $F_{Nj}$.

What is claimed is:

1. An indirect synthesizer for producing asine wave output signal $f_o$ with a switchable frequency comprising:
   (a) a frequency switching control unit for generating signals which indirectly produce a transition to the desired sine wave output signal frequency;
   (b) a prepositioning voltage generator for providing a prepositioning signal $V_{NP}$ corresponding to the desired sine wave output signal frequency called for by a signal from said frequency switching control unit;
   (c) a frequency switchable phase loop including a signal controlled oscillator having a control input and an output for providing said sine wave output signal, the frequency of said output signal $f_N$ which serves as the output $f_o$ of the synthesizer being controlled by a control signal $V_N$ applied to said control input,
   a programmable divider having a programming input coupled to said frequency switching control unit, for dividing the output of said oscillator by N, the value of N being determined by a signal from said frequency switching control unit, said divider providing a submultiple of oscillator frequency $f_N$ at an output thereof,
   a comparator circuit for comparing the output of said programmable divider with a reference signal input thereto and providing an error signal $V_{NE}$ indicative of that comparison,
   a summing circuit for summing said error signal $V_{NE}$ from said comparator with said prepositioning signal $V_{NP}$ from said prepositioning voltage generator and providing said control signal $V_N$ at an output thereof coupled to said control input of said oscillator for controlling its output frequency $f_N$; and
   (d) a memory having an input coupled to said output of said summing circuit for receiving values of $V_N$ for storing a value of $V_N$ at a time of a frequency switchover of output frequency from one output frequency to another, an output for delivering to said prepositioning voltage generator a value of control voltage $V_N$ stored at a previous transition to the desired output frequency and an input coupled to said frequency switching control unit for receiving an instruction therefrom specifying the desired output frequency, the memory device delivering the appropriate value of $V_N$ to the prepositioning voltage generator corresponding to the desired output frequency of said oscillator.

2. An indirect frequency synthesizer according to claim 1 wherein said phase loop further comprises a low pass filter coupled between said comparator and said summing circuit.

3. An indirect frequency synthesizer according to claim 1 wherein the appropriate value of $V_N$ is a value of $V_N$ stored during a previous transition to the desired output frequency.

4. An indirect synthesizer according to claim 1 wherein the appropriate value of $V_N$ is a value derived from a plurality of measured samples of $V_N$ made at successive previous transitions to the desired frequency.

5. An indirect synthesizer for producing a sine wave output signal $f_o$ with a switchable frequency comprising:

(a) a frequency switching control unit for generating signals which indirectly produce a transition to the desired sine wave output signal frequency;

(b) a coarse prepositioning voltage generator for providing a coarse prepositioning signal $V_{NG}$ corresponding to the desired output signal frequency called for by a signal from said frequency switching control unit;

(c) a fine prepositioning voltage generator for providing a fine prepositioning signal $V_{NF}$ corresponding to the desired output frequency called for by a signal from said frequency switching control unit;

(d) a frequency switchable phase loop including a signal controlled oscillator having a control input and an output for providing said sine wave output signal, the frequency of said output signal $f_N$ which serves as the output $f_o$ of the synthesizer being controlled by a control signal $V_N$ applied to said control input, a programmable divider having a programming input coupled to said frequency switching control unit, for dividing the output of said oscillator by N, the value of N being determined by a signal from said frequency switching control unit, said divider providing a submultiple of oscillator frequency $f_N$ at an output thereof, a comparator circuit for comparing the output of said programmable divider with a reference signal input thereto and providing an error signal $V_{NE}$ indicative of that comparison, a summing circuit for summing said error signal $V_{NE}$ from said comparator with said coarse and fine prepositioning signal $V_{NG}$ and $V_{NF}$, from said coarse and fine prepositioning voltage generators, respectively and providing said control signal $V_N$ at an output thereof coupled to said control input of said oscillator for controlling its output frequency $f_N$;

(e) a memory for storing values of $V_{NF}$ for controlling said fine prepositioning generator in response to a signal from said frequency switching control device, the value of $V_{NF}$ corresponding to each desired frequency being updated during operation of the synthesizer;

(f) residual error measuring means for measuring the value of $V_{NE}$ at various times during operation of the synthesizer; and (g) correction logic circuit means for receiving values of $V_{NE}$ measured by said residual error measuring means and for receiving values of $V_{NF}$ previously stored in memory and providing values of $V_{NF}$ to said fine prepositioning generator for controlling the value of $V_{NF}$ provided thereby to said summing circuit at the time of a transition to the desired frequency.

6. A synthesizer according to claim 5 further including a low pass filter coupled between said comparator and said summing circuit.

7. An indirect synthesizer according to claim 5 wherein said residual error measuring means comprises an analog-to-digital conversion and sampling device.

8. An indirect synthesizer according to claim 5 wherein said coarse prepositioning generator comprises a digital-to-analog converter controlled directly by said frequency switching control device.

9. An indirect synthesizer according to claim 5 wherin said coarse prepositioning generator comprises a digital-to-analog converter controlled indirectly by said frequency switching control device via a read only memory (ROM) addressed by said frequency switching control device and which provides compensation for nonlinearities of the voltage-frequency characteristic of said signal controlled oscillator.

10. An indirect synthesizer for producing a sine wave output signal $f_0$ with a switchable frequency comprising:

a frequency switching control unit for generating signals which indirectly produce a transition to the desired sine wave output signal frequency;

a coarse prepositioning voltage generator for providing a coarse prepositioning signal $V_{NG}$ corresponding to the desired output signal frequency called for by a signal from said frequency switching control unit;

a fine prepositioning voltage generator for providing a fine preopositioning signal $V_{NF}$ corresponding to the desired output frequency;

a signal controlled oscillator having a control input and an output for providing said sine wave output signal, the frequency of said output signal $f_N$ which serves as the output $f_0$ of the synthesizer being controlled by a control signal $V_N$ applied to said control input;

a programmable divider circuit having a programming input coupled to said frequency switching control unit for dividing the output of said oscillator by N, the value of N being determined by a signal from said frequency switching control unit, said divider providing a submultiple of oscillator frequency $f_N$ at an output thereof;

a comparator circuit for comparing the output of said programmable divider with a reference signal input thereto and providing an error signal $V_{NE}$ indicative of that comparison;

a low pass filter circuit for filtering $V_{NE}$ from said comparator and providing a zero output signal at the direction of said frequency switching control unit;

a first summing circuit for summing a value of $V_{NE}$ from said low pass filter circuit with a value of $V_{NF}$ from said fine prepositioning generator to provide a signal $V'_{NF}$;

a second summing circuit for summing $V'_{NF}$ with $V_{NG}$ from said coarse prepositioning generator and providing said control signal $V_N$ to said signal controlled oscillator;

measuring circuit means coupled to the output of said first summing circuit for measuring an instantaneous value of $V'_{NF}$;

a memory having an input coupled to said measuring circuit means for memorizing values of $V'_{NF}$ and providing them, at the direction of said frequency switching control unit to said fine prepositioning generator causing said fine prepositioning generator to supply an appropriate value of $V_{NF}$ to said first summing circuit whereby during operation of said synthesizer, values of $V'_{NF}$ are updated in memory for updating values of $V_{NF}$ provided to said first summing circuit by said fine prepositioning generator by causing said low pass filter circuit to produce a zero output and measuring the value of $V'_{NF}$ for updating said memory.

11. A synthesizer according to claim 10 wherein said coarse prepositioning voltage generator comprises a digital-to-analog converter controlled by a read only memory (ROM) addressed by said frequency switching control unit.

12. A synthesizer according to claim 11 wherein said fine prepositioning generator comprises a sample and hold device.

13. A synthesizer according to claim 10 wherein said fine prepositioning generator comprises a sample and hold device.

14. An indirect synthesizer for producing a sine wave output signal $f_0$ with a switchable frequency comprising:
- a frequency switching control unit for generating signals which indirectly produce a transition to the desired sine wave output signal frequency;
- a coarse prepositioning voltage generator for providing a coarse prepositioning signal $V_{NG}$ corresponding to the desired output signal frequency called for by a signal from said frequency switching control unit;
- a fine prepositioning voltage generator for providing a fine prepositioning signal $V_{NF}$ corresponding to the desired output frequency;
- a signal controlled oscillator having a control input and an output for providing said sine wave output signal, the frequency of said output signal $f_N$ which serves as the output $f_0$ of the synthesizer being controlled by a control signal $V_N$ applied to said control input;
- a programmable divider circuit having a programming input coupled to said frequency switching control unit for dividing the output of said oscillator by N, the value of N being determined by a signal from said frequency switching control unit, said divider providing a submultiple of oscillator frequency $f_N$ at an output thereof;
- a comparator circuit for comparing the output of said programmable divider with a reference signal input thereto and providing an error signal $V_{NE}$ indicative of that comparison;
- a first summing circuit for summing said error signal $V_{NE}$ with $V_{NF}$ to provide a signal $V'_{NF}$; and
- a second summing circuit for summing $V'_{NF}$ with $V_{NG}$ to provide said control signal $V_N$;
- said fine prepositioning voltage generator circuit including:
  - a filter circuit coupled to the output of said first summing circuit for filtering $V'_{NF}$,
  - an amplifier having a noninverting input coupled to the output of said filter circuit, an inverting input and an output,
  - a successive approximation logic circuit coupled to the output of said amplifier said successive approximation logic circuit having control inputs for receiving commands from said frequency switching control device and an output,
  - a random access memory having a control input coupled at said frequency switching control unit and a read write input and an input coupled to the output of said successive approximation logic circuit,
  - a digital-to-analog converter coupled to the output of said random access memory for providing an analog signal, the output of said digital-to-analog converter coupled to the inverting inut of said amplifier, and
  - a sample and hold circuit coupled to the output of said digital-to-analog converter for providing VHD NF to said first summing circuit;

whereby the fine prepositioning voltage generator is operated after the synthesizer has stabilized at a particular frequency to memorize a value of $V'_{NF}$ for use in later transistions to the desired frequency, the value of $V_{NF}$ supplied to said first summing circuit being derived by successive approximations based on filtered values of $V'_{NF}$, the result of successive approximation being stored in said RAM.

15. An indirect synthesizer for providing a sine wave output signal $F_0$ with a switchable frequency comprising:
- computer means for generating signals which indirectly produce a transition to the desired sine wave output frequency;
- a microprocessor based prepositioning voltage generator for providing a coarse prepositioning signal $V_{NG}$ and a fine prepositioning signal $V_{NF}$ corresponding to the desired output signal frequency called for by said computer means;
- a signal controlled oscillator having a control input and an output for providing said sine wave output signal the frequency of said output signal $F_N$ which serves as the output $F_0$ of the synthesizer being controlled by a controlled signal $V_N$ applied to said control input;
- a programmable divider circuit having a programming input coupled to said prepositioning voltage generator for dividing the output of said oscillator by N, the value of N being determined by a signal from said prepositioning voltage generator, said divider providing a submultiple of oscillator frequency $F_N$ at an output thereof;
- a comparator circuit for comparing the output of said programmable divider with a reference signal input thereto and providing an error signal $V_{NE}$ indicative of that comparison;
- filter circuit means coupled to the output of said comparator for filtering $V_{NE}$ or providing in response to a control signal from said prepositioning generator a zero output;
- a first summing circuit for summing $V_{NE}$ from said filter circuit with $V_{NF}$ from said prepositioning generator and providing an output $V'_{NF}$; and
- a second summing circuit for summing $V'_{NF}$ with $V_{NG}$ from said prepositioning generator and providing said control signal $V_N$ to said signal controlled oscillator,
- said prepositioning voltage generator including
  - an amplifier having an inverting input coupled to the output of said first summing circuit for receiving values of $V'_{NF}$, a noninverting input and an output,
  - an approximation logic circuit coupled to the output of said amplifier,
  - a register coupled to the output of said approximation logic and providing a control signal to said programmable divider,
  - a slow interface circuit for receiving instructions from said computer means,
  - a random access memory,
  - a digital-to-analog converter coupled to said interface and to said random access memory for providing an analog signal output,
  - a first sample and hold circuit having an input coupled to said digital-to-analog converter for supplying $V_{NF}$ to said first summing circuit,
  - a second sample and hold circuit having an input coupled to said digital-to-analog converter for providing an output $V_{NG}$ to said second summing circuit,
a programmable read only memory, and
a sequential logic circuit coupled to said programmable read only memory for providing control signals to said low pass filter circuit for causing it to provide a zero output and for providing control signals to said first and second sample and hold circuits and said approximation logic;
a bus coupling said approximation logic, D-to-A converter, RAM and slow interface;
a microprocessor coupled to said bus; and
a fast interface circuit coupling said bus to said computer means, the programmable read only memory including values of coarse prepositioning, the RAM including values of fine prepositioning voltage, the slow interface permitting modes of initializing and control and the fast interface permitting normal mode operation of fast transfer and priority interrupt for said microprocessor, the prepositioning voltage generator storing and updating values of $V'_{NF}$ during stable operation of the synthesizer to provide values of $V_{NG}$ and $V_{NF}$ for subsequent transitions to the desired frequency.

16. A synthesizer according to claim 15 wherein said first and second summing circuits, signal controlled oscillator, programmable divider, comparator, low pass filter circuit, and first and second sample and hold devices together define a first loop for providing a first synthesizer output and wherein the synthesizer further includes a second loop substantially identical to said first loop and wherein there is provided an additional register each register controlling the functions of one of said loops.

* * * * *